United States Patent
Perisetty

(10) Patent No.: US 7,639,041 B1
(45) Date of Patent: Dec. 29, 2009

(54) HOTSOCKET-COMPATIBLE BODY BIAS CIRCUITRY WITH POWER-UP CURRENT REDUCTION CAPABILITIES

(75) Inventor: Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/181,313

(22) Filed: Jul. 28, 2008

(51) Int. Cl.
*H03K 19/173* (2006.01)
(52) U.S. Cl. .............................. 326/38; 326/81; 327/537
(58) Field of Classification Search .................... 326/21, 326/26, 27, 37, 80, 81, 82, 83; 327/534–537
See application file for complete search history.

(56) References Cited

U.S. PATENT DOCUMENTS

| | | | |
|---|---|---|---|
| 7,119,574 B1 * | 10/2006 | Lee et al. ........................ | 326/41 |
| 7,330,049 B2 | 2/2008 | Perisetty | |
| 7,355,437 B2 | 4/2008 | Perisetty | |
| 7,573,317 B2 * | 8/2009 | Lewis et al. .................. | 327/534 |
| 2001/0019285 A1 * | 9/2001 | Lin et al. ..................... | 327/534 |

* cited by examiner

*Primary Examiner*—Don P Le
(74) *Attorney, Agent, or Firm*—Treyz Law Group; G. Victor Treyz

(57) ABSTRACT

An integrated circuit is provided that has circuitry containing metal-oxide-semiconductor transistors with body terminals. The body terminals may be biased with an externally supplied body bias voltage that reduces power consumption. During power-up operations, the external body bias voltage may temporarily not be available. In this situation, boost circuitry may produce an internal power supply signal that may be used in place of the unavailable external body bias voltage, thereby reducing leakage currents and power consumption during power up. A multiplexer may be used in routing an appropriate body bias signal to the transistors. The boost circuitry and multiplexer may be controlled by control signals that are generated by control logic. The control logic may produce the control signals by monitoring external and internally generated power supply voltage levels during power up operations.

23 Claims, 6 Drawing Sheets

HOTSOCKET-COMPATIBLE BODY BIAS CIRCUITRY WITH POWER-UP CURRENT REDUCTION CAPABILITIES

BACKGROUND

This invention relates to hotsocket compatible circuits, and more particularly, to hotsocket-compatible transistor body bias circuits for integrated circuits.

The performance of modern integrated circuits is often limited by power consumption considerations. Circuits with poor power efficiency place undesirable demands on system designers. Power supply capacity may need to be increased, thermal management issues may need to be addressed, and circuit designs may need to be altered to accommodate inefficient circuitry.

Integrated circuits often use complementary metal-oxide-semiconductor (CMOS) transistor technology. CMOS integrated circuits have n-channel metal-oxide-semiconductor (NMOS) and p-channel metal-oxide-semiconductor (PMOS) transistors.

NMOS and PMOS integrated circuits have four terminals—a drain, a source, a gate, and a body. The body terminal, which is sometimes referred to as the well or bulk terminal, can be biased to reduce power consumption. For example, a positive bias voltage can be applied to the body of a PMOS transistor and a negative bias voltage can be applied to the body of an NMOS transistor. These bias voltages can increase the effective threshold voltages of the transistors and thereby reduce their leakage currents. Reductions in leakage current reduce power consumption.

Body bias voltages may be supplied from an external source. When an integrated circuit is operating normally in a system, an externally supplied body bias voltage may be applied to a transistor body bias terminal to reduce leakage current. However, during power-up operations, situations may arise in which the externally supplied body bias voltage is not valid, even though other power supply voltages are valid. This type of situation, which is sometimes referred to as a hotsocket condition, may lead to undesirably large transistor currents, because the current reducing effects of the body bias voltage are not available in the absence of the external body bias voltage. Collectively, these transistor currents can create undesirable current surges and large power losses during power up.

It would therefore be desirable to provide transistor body bias voltage circuitry capable of reducing power consumption on integrated circuits during hotsocket conditions.

SUMMARY

In accordance with the present invention, circuitry is provided for body biasing transistors on an integrated circuit to reduce leakage currents and associated static power consumption. During normal operation when the integrated circuit is fully powered, the integrated circuit may receive an external positive power supply signal and an elevated external positive power supply signal. The positive power supply signal may have a voltage that is suitable for powering core logic on the integrated circuit. The elevated external power supply signal may serve as the body bias voltage for transistors on the integrated circuit.

The integrated circuit may be hotsocket compatible. In a hotsocket compatible arrangement, it cannot be guaranteed that both of the externally supplied power supply signal will always be valid. For example, the elevated power supply signal may not be valid while the core logic supply is valid for a period of time during power up. To ensure that the transistors are properly body biased during this situation, a boost circuit on the integrated circuit may produce a boosted voltage from the valid power supply signal. This boosted voltage may be temporarily used as the body bias signal while waiting for the elevated power supply signal to become valid.

A multiplexer may be used in routing an appropriate body bias signal to the transistors. The boost circuit and multiplexer may be controlled by control signals that are generated by control logic. The control logic may produce the control signals by monitoring external and internally generated power supply voltage levels during power up operations.

Further features of the invention, its nature and various advantages will be more apparent from the accompanying drawings and the following detailed description.

DETAILED DESCRIPTION

The present invention relates to body bias circuitry. The body bias circuitry may be used to bias the body terminals of p-channel metal-oxide-semiconductor (PMOS) transistors and n-channel metal-oxide-semiconductor (NMOS) transistors. The body bias circuitry may be used on any suitable integrated circuits. The integrated circuits on which the body bias circuitry is implemented may be, for example, memory chips, digital signal processing circuits, microprocessors, application specific integrated circuits, programmable logic device integrated circuits, analog-to-digital converter circuits, communications circuits, transceiver circuits, or any other suitable integrated circuits that contain transistors with body terminals.

Figure 1:
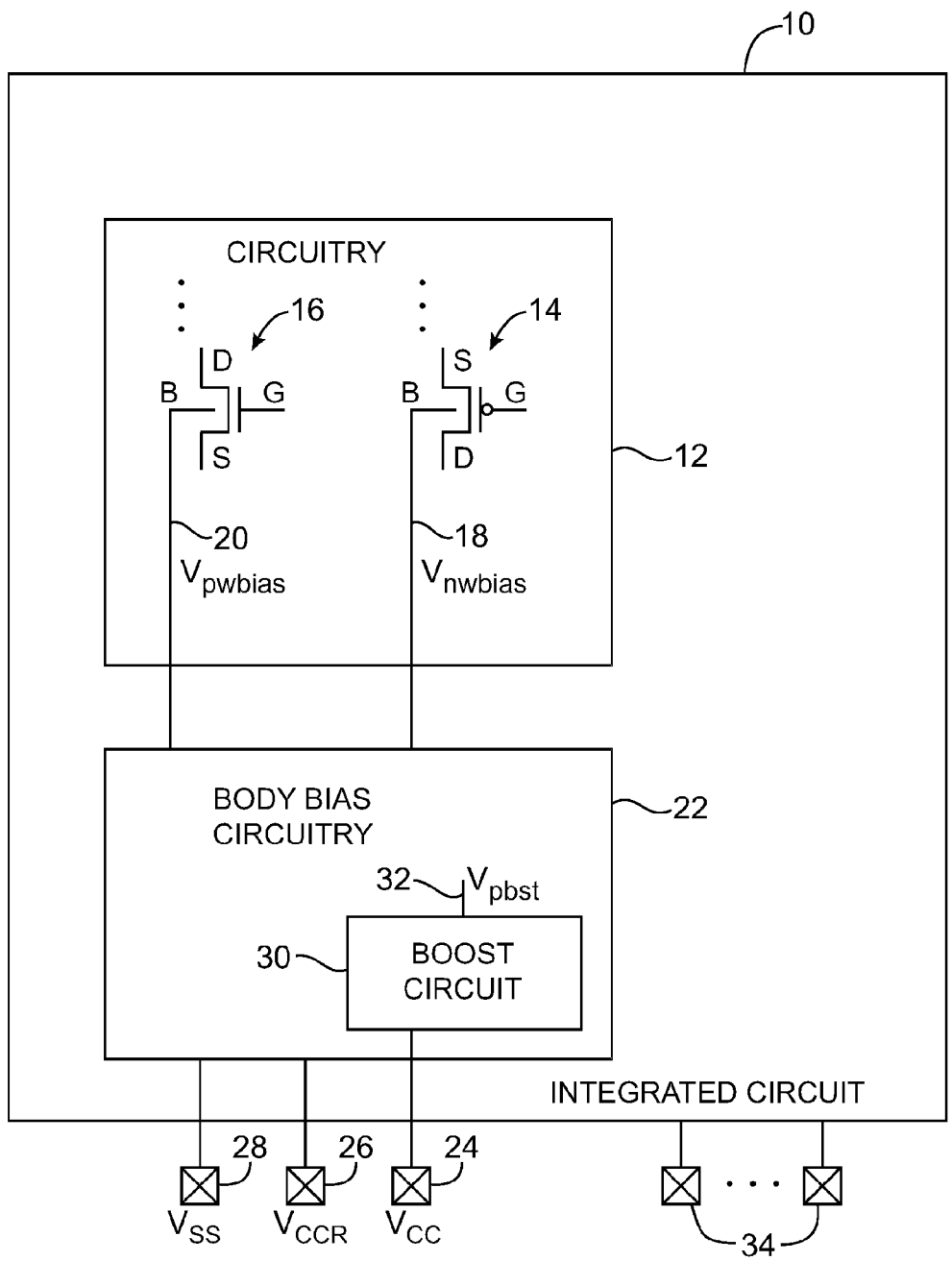
FIG. 1 is a diagram of an illustrative integrated circuit with body bias circuitry in accordance with an embodiment of the present invention.

An illustrative integrated circuit that contains circuitry in which body biases may be applied is shown in FIG. 1. Integrated circuit 10 may be a memory chip, a digital signal processor, a microprocessor, an application specific integrated circuit, a programmable logic device integrated circuit, an analog-to-digital converter circuit, a communications circuit, a transceiver circuit, or any other suitable integrated circuit. Circuitry 12, all or some of which may be logic circuitry such as core logic on a programmable logic device or other suitable integrated circuit, may be used to implement desired circuit features (e.g., memory circuitry, analog circuits, digital circuits, processing circuits, etc.).

Integrated circuit 10 may include p-channel metal-oxide semiconductor (PMOS) transistors such as transistor 14 and n-channel metal-oxide semiconductor transistors such as transistor 16. Transistors 14 and 16 may have source terminals S and drain terminals D (collectively "source-drain" terminals). Transistors 14 and 16 may also have gate terminals G and body terminals B.

Body bias voltages Vpwbias and Vnwbias may be applied respectively to body bias terminals B of transistors 16 and 14 using respective body bias paths such as paths 20 and 18. Body bias voltages Vpwbias and Vnwbias may be selected so as to increase or decrease the threshold voltages of transistors 14 and 16. With one suitable arrangement, Vpwbias may be negative and Vnwbias may be positive at a voltage greater than the positive power supply voltage for circuitry 12 (i.e., at a voltage greater than a voltage Vcc that is applied to at least some of the source terminals of transistors 14). With these values, the threshold voltages of transistors 14 and 16 are increased, thereby reducing leakage currents and conserving power. For example, when a sufficiently elevated voltage Vnwbias is applied to the n-type bodies of PMOS transistors 14, the threshold voltages of transistors 14 will be increased, thereby reducing Ioff for these transistors and helping to minimize power consumption by integrated circuit 10.

Body bias circuitry 22 may be used to in applying body bias voltages to circuitry 12. These body bias voltages may be produced using any suitable arrangement. Consider, as an example, positive body bias voltage Vnwbias, which is preferably elevated with respect to positive power supply voltage Vcc. During normal operation of integrated circuit 10, it may be desirable to supply the positive voltage Vnwbias from an external source. The external source may be a power supply that is contained in a system in which integrated circuit 10 is operating. The external power supply may, if desired, be mounted on the same printed circuit board in the system as integrated circuit 10 or may be mounted on another circuit board or elsewhere in the system. The external power supply may supply a nominally fixed voltage. This voltage, which may be referred to as Vccr, is shown as being applied to input-output pin 26 in FIG. 1. An example of a suitable voltage for Vccr is 1.5 volts. Other voltages (e.g., more than or less than 1.5 volts and more than Vcc) may be used for Vccr if desired.

As shown in FIG. 1, integrated circuit 10 may have additional input-output pins such as power supply pins 28 and 26 and signal pins 34. Power supply pins such as ground power supply pin 28 may be used to receive a ground power supply voltage Vss (e.g., a voltage of 0 volts or a higher or lower value) to integrated circuit 10. Power supply pins such as power supply pin 26 may be used to supply a positive power supply voltage Vcc (e.g., a voltage of 0.9 volts) to integrated circuit 10. If desired, additional power supply voltages may be supplied to integrated circuit 10. Moreover, power supply voltages of different magnitudes may be supplied. For example, positive power supply voltages Vcc of greater than or less than 0.9 volts may be supplied. Signal pins 34 may be used as data input and output pins.

Power pins such as power pins 28, 26, and 24 and other suitable power pins and data pins such as data pins 34 may be implemented using any suitable conductive structures (e.g., conductive pads, solder balls, etc.). Data pins 34 may be coupled to input-output circuits (input-output buffers). The input-output circuits may be located around the periphery integrated circuit 10. Data pins 34 may be used to convey data signals to and from the input-output circuits.

The power pins on integrated circuit 10 may be used to supply power supply voltages to the input-output circuits and other circuitry on integrated circuit 10 (e.g., core logic). Core logic, input-output circuits, and other circuitry in device 10 (shown as circuitry 12 in FIG. 1) may be powered using positive voltage Vcc, body bias voltages such as body bias voltages derived from Vccr (e.g., a voltage that is elevated with respect to voltage Vcc), and ground voltage Vss received through the power pins. In a typical arrangement, the sources of at least some of the transistors 14 are maintained at Vcc.

The pins on an integrated circuit such as integrated circuit 10 may be used to form ports. For example, the pins on integrated circuit 10 may be used in forming communications ports that support standards such as the universal serial bus (USB) standard, the Firewire standard (IEEE 1394), serial bus ports, parallel bus ports, etc. Electronic components that use these ports are often designed to be hot swappable. A hot-swappable component can be inserted into a system or removed from a system without powering down the system.

When a hot-swappable peripheral such as a peripheral containing integrated circuit 10 is connected to a powered port, it is not known in advance which pins in the port will be the first to make electrical contact with each other. If a user inserts the peripheral in one way, the power pins in the port may be powered up in one order (e.g., by powering up Vcc pin 24 and Vss pin 28 before powering up Vccr pin 26). If, however, the user inserts the peripheral in a slightly different way, the power pins may be powered up in a different order (e.g., by powering up Vccr pin 26 and Vss pin 28 before powering up Vcc pin 24). This type of uncertainty about the order in which the pins are connected should be taken into account so that power consumption is minimized by body biasing under all possible power up scenarios.

Consider, as an example, the situation in which Vccr becomes valid before Vcc. In this situation, body bias circuitry 22 may derive body bias voltage Vnwbias from voltage Vccr (e.g., Vccr may serve as Vnwbias) and may apply Vnwbias to body terminals B of PMOS transistors 14. Because a valid body bias voltage Vnwbias is being applied to transistors 14, Ioff is reduced and power consumption is minimized during subsequent power-up operations (i.e., while Vcc is being powered up and is becoming valid). If, however, Vcc becomes valid before Vccr, a body bias voltage Vnwbias that is derived only from Vccr would not be available to reduce Ioff in transistors 14 until Vccr has been powered up. The time required for Vccr to become powered up depends on the way in which a user has inserted a peripheral into a socket, and could be considerable, leading to undesired high levels of current and power consumption during power up.

In accordance with the present invention, body bias circuitry 22 may be provided with voltage boosting circuitry such as boost circuit 30. Boost circuit 30 may generate an elevated power supply voltage on output 32 such as a power supply voltage Vpbst. The voltage Vpbst may be a boosted voltage that is produced from a lower-voltage source such as voltage Vcc. The Vpbst voltage may be, for example, about 1.2 volts and may be temporarily used in place of Vccr in producing the body bias voltage Vnwbias. Because Vpbst may be produced from power supply voltage Vcc, Vpbst and therefore Vnwbias may be generated even in the absence of Vccr. This ensures that an appropriate elevated Vnwbias voltage will be available for reducing Ioff in PMOS transistors 14 during power up operations in which Vccr is not yet valid. The helps to minimize power consumption, because it avoids the situation in which transistors 14 are powered but are not properly supplied with a leakage-current-reducing body bias voltage.

Figure 2:
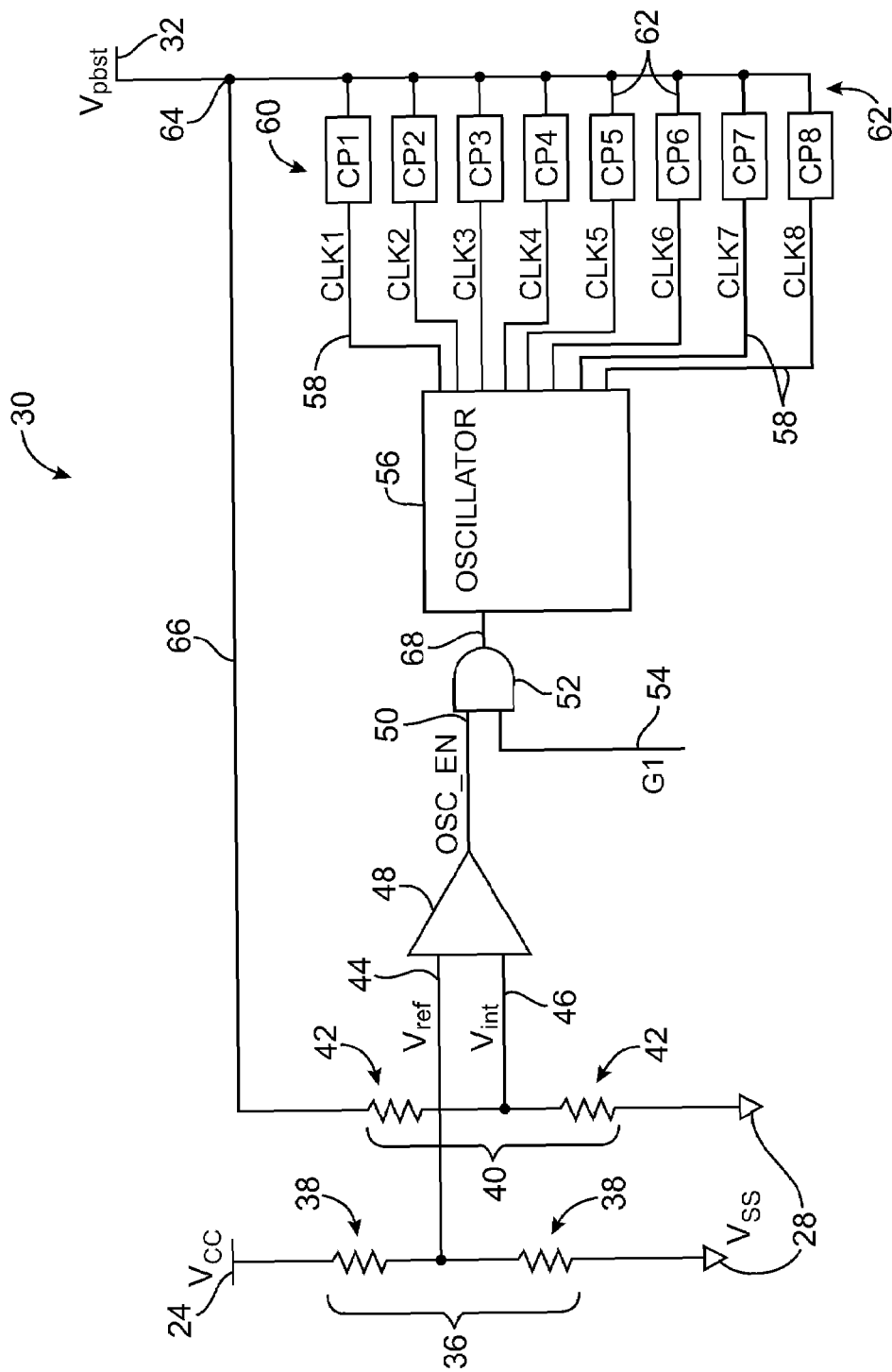
FIG. 2 is a diagram of illustrative voltage boosting circuitry that may be used in a body bias circuit in accordance with an embodiment of the present invention.

Illustrative circuitry that may be used to implement a boost circuit such as boost circuit 30 of FIG. 1 is shown in FIG. 2. As shown in FIG. 2, boost circuit 30 may have charge pump circuitry 60. Charge pump circuitry 60, which is powered by power supply voltage Vcc (e.g., 0.9 volts), produces a boosted voltage Vpbst (i.e., a voltage greater than 0.9 volts such as 1.2 volts) on output lines 64. Output lines 64 are connected to node 64 and output line 32.

In the example of FIG. 2, charge pump circuitry 60 includes eight charge pumps (labeled CP1, CP2, CP3, CP4, CP5, CP6, CP7, and CP8). Charge pumps 60 are driven by respective clock signals CLK1, CLK2, CLK3, CLK4, CLK5, CLK6, CLK7, and CLK8, which are received on lines 58 from oscillator 56. Each of the clock signals for charge pumps 60 may be shifted in phase with respect to the next. For example, if there are eight charge pumps as in the FIG. 2 example, each clock may be shifted in phase by 45° (360°/8) with respect to the next. In particular, CLK2 may be shifted in phase by 45° with respect to CLK1, CLK3 may be shifted in phase by 45° with respect to CLK2, CLK4 may be shifted in phase by 45° with respect to CLK3, etc. The output voltage Vpbst on node 64 may be fed back to the input of circuit 30 via feedback path 66.

If desired, there may be more charge pumps 60 in boost circuit 30 or fewer charge pumps 60 in boost circuit 30. An advantage of using more charge pumps 60 is that this tends to reduce output ripple. However, care should be taken not to use an excessive number of charge pumps, because this may consume more area on integrated circuit 10 and may require more bandwidth in the control loop through circuit 30. If fewer pumps 60 are used, ripple may be increased somewhat, but resources will be conserved.

Comparator 48 may compare the feedback signal from feedback path 66 with a reference voltage Vref that is derived from Vcc. Voltage dividers 36 and 40 may be used to present reference voltage Vref and feedback voltage Vint to the inputs of comparator 48. Voltage divider 36 may include resistors 38. Voltage divider 40 may contain resistors 42. The magnitudes of resistors 38 and 42 may be selected so that suitably scaled versions of Vcc and Vpbst are provided to the inputs of comparator 48. For example, resistors 38 may be configured so that the voltage Vref on path 44 will be 0.5 volts when voltage Vcc is fully powered (e.g., when voltage Vcc is at 0.9 volts in the present example). Resistors 42 may be configured so that voltage Vint will be 0.5 volts when Vpbst is at 1.2 volts (as an example).

As comparator 48 compares the voltages Vref and Vint (e.g., the scaled versions of Vcc and Vpbst), comparator 48 produces a corresponding oscillator control signal OSC_EN on output path 50. With one suitable arrangement, which is described herein as an example, oscillator control signal OSC_EN will be at a logic high value (i.e., a "1") when Vint is less than Vref and will be at a logic low value (i.e., "0") when Vint is greater than Vref. Control logic such as AND gate 52 may be used to control whether oscillator control signal OSC_EN is applied to control input 68 of oscillator 56. Gate 52 may receive oscillator control signal OSC_EN on input path 50 and may receive control signal G1 on input 54 and may produce a corresponding output signal on output path 68. When control signal G1 is low, gate 52 and therefore oscillator 56 and boost circuit 30 will be disabled. In this situation, the output on path 68 will not change, regardless of that state of input path 50. When, however, control signal G1 is high, gate 52 is enabled. When gate 52 is enabled, the value of the signal on path 68 will track the value of OSC_EN on path 50 (i.e., signal OSC_EN will be applied to input 68 of oscillator 56). In this situation, the OSC_EN signal may be used to turn oscillator 56 on and off to control the magnitude of Vpbst. Oscillator 56 may be, for example, a current controlled oscillator and may be enabled when the value of OSC_EN is high (as an example).

The arrangement of FIG. 2 forms a control loop for circuit 30 that ensures that the output voltage Vpbst will be locked relative to the value of Vcc (when control signal G1 is high).

If Vpbst falls below 1.2 volts, this drop in Vpbst will be detected by comparator 48, which will take signal OSC_EN high. The high signal OSC_EN will enable oscillator 56, which will produce active clock signals on clock lines 58. These clock signals will activate charge pumps 60 and will cause the output voltage produced by charge pumps 60 to rise.

When Vpbst rises above 1.2 volts, the output of comparator 48 flips, taking signal OSC_EN low. The low OSC_EN signal will disable oscillator 56 and will thereby turn off charge pump circuitry 60. With the charge pumps disabled in this way, the voltage Vpbst to drift lower.

This feedback arrangement operates continuously, so that Vpbst is locked to 1.2 volts when Vcc is maintained at 0.9 volts (in the present example).

Figure 3:
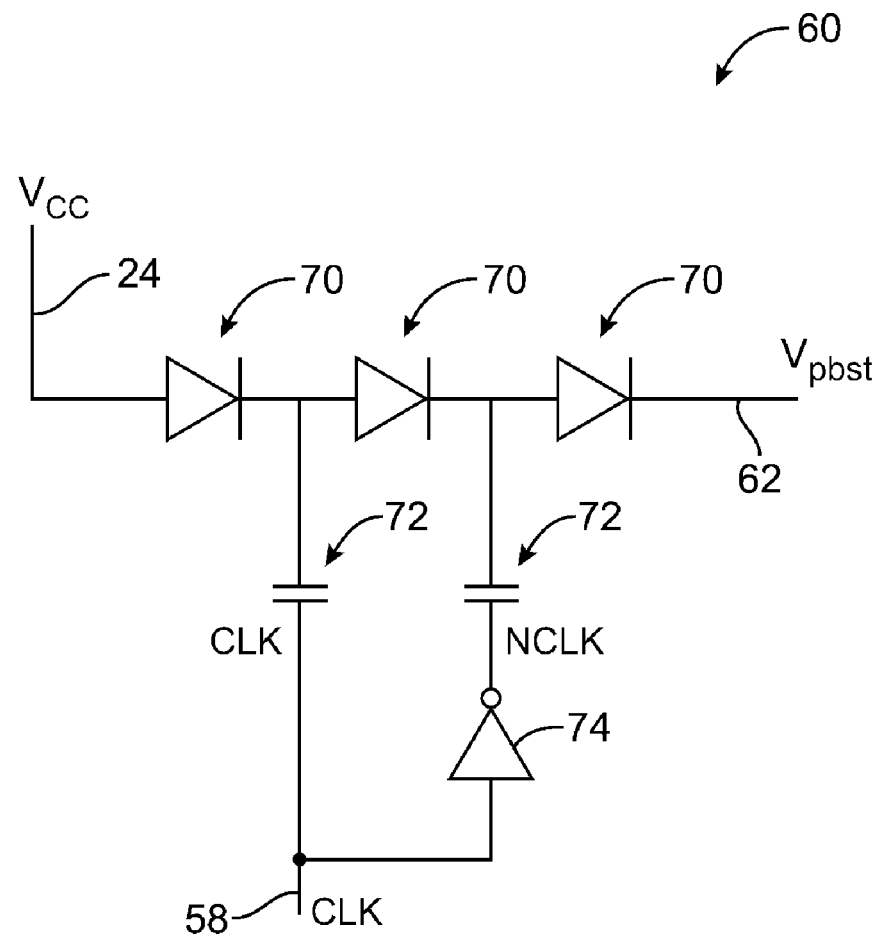
FIG. 3 is a diagram of an illustrative charge pump that may be used in a voltage boosting circuit for a body bias circuit in accordance with an embodiment of the present invention.

Any suitable charge pump circuitry may be used for charge pumps 60. As an example, a positive charge pump such as charge pump 60 of FIG. 3 may be used for each of charge pumps 60. As shown in FIG. 3, a clock signal CLK may be received at input 58. Inverter 74 may invert signal CLK to produce inverted clock signal NCLK. Signals CLK and NCLK may be applied to capacitors 72. Capacitors 72 may be connected to nodes N1 and N2 in a chain of diodes 70. Capacitors 72 may be formed from any suitable capacitor structures such as metal-oxide-semiconductor capacitor structures. Diodes 72 may be formed from p-n junction diodes or from diode-connected metal-oxide-semiconductor transistors. There are three diodes 70 and two capacitors 72 in the example of FIG. 3, but more stages may be added to charge pump 60 if desired. When clocked using clock signal CLK, the charge pump circuit 60 produces values of Vpbst that are elevated with respect to input power supply voltage Vcc.

Figure 4:
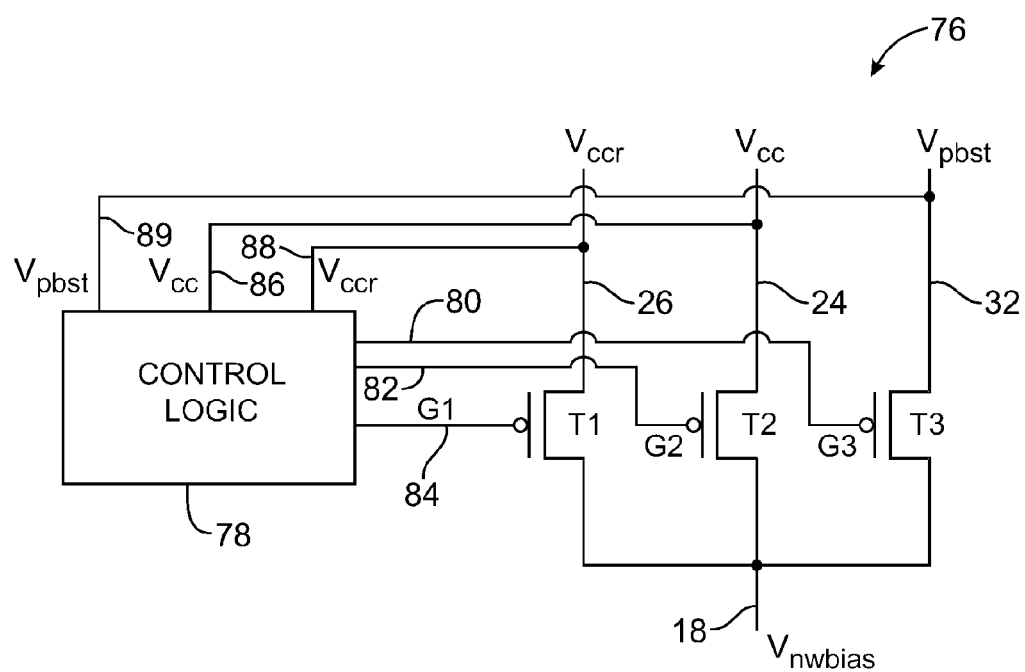
FIG. 4 is a diagram of illustrative body bias circuitry that may be used in applying a body bias voltage during a variety of power supply conditions including hotsocket conditions in accordance with an embodiment of the present invention.

An illustrative control circuit that may be used in body bias circuitry 22 of FIG. 1 to produce body bias voltage Vnwbias based on voltages Vccr, Vcc, and Vpbst is shown in FIG. 4. Control circuit 76 may receive elevated power supply voltage Vccr from an external source at input 26. Positive power supply voltage Vcc may be received from an external source at input 24. Boosted power supply voltage Vpbst may be received at input 32 from an internal source such as boost circuit 30 of FIG. 2. Control logic 78 may control which of transistors T1, T2, and T3 are off and which of transistors T1, T2, and T3 are on, thereby controlling which of the input power supply signals is routed to output line 18 to serve as body bias signal Vnwbias. As shown in FIG. 1, body bias Vnwbias may be applied to body terminals B of PMOS transistors 14 to reduce Ioff.

Transistors T1, T2, and T3 may be PMOS transistors. Transistor T1 may have a control gate that receives control signal G1 from control logic 78 via control path 84. Path 82 may be used to convey control signal G2 to the gate of transistor T2. Transistor T3 may have a gate that receives control signal G3 from control logic 78 via control path 80. At any given time, one of transistors T1, T2, and T3 is preferably turned on while the remaining transistors are turned off.

Control logic 78 may monitor the magnitudes of Vcc, Vccr, and Vpbst using respective inputs 86, 88, and 89 and may produce control signals G1, G2, and G3 accordingly. When Vccr is greater than both Vcc and Vpbst, control signal G1 is taken low and signals G2 and G3 are taken high. This turns on transistor T1 while turning off transistors T2 and T3, so that Vnwbias will be equal to Vccr. As a result, the Vnwbias signal will be provided by Vccr whenever Vccr is valid.

When Vccr is less than Vcc, Vnwbias will be set to Vcc by taking G2 low and taking G1 and G3 high (if Vcc is greater than Vpbst) or will be set to Vpbst by taking G3 low and taking G1 and G2 high (if Vcc is less than Vpbst). It is desirable to ensure that the source-to-bulk junction of each transistor 14 is reverse biased to avoid latch up. It is also desirable to increase the threshold voltage of each transistor 14 to reduce Ioff. These conditions will generally be achieved when Vnwbias is set to the boosted voltage Vpbst. If, however, Vpbst has not yet risen as high as Vcc, control logic 78 will set Vnwbias to Vcc, so that the larger of the two available positive voltages is used for body biasing transistors 14. In this way, control circuit 78 protects circuit 10 from damage by avoiding situations in which the source-to-bulk junctions of transistors 14 would be forward biased (which could lead to undesirable latch up).

Figure 5:
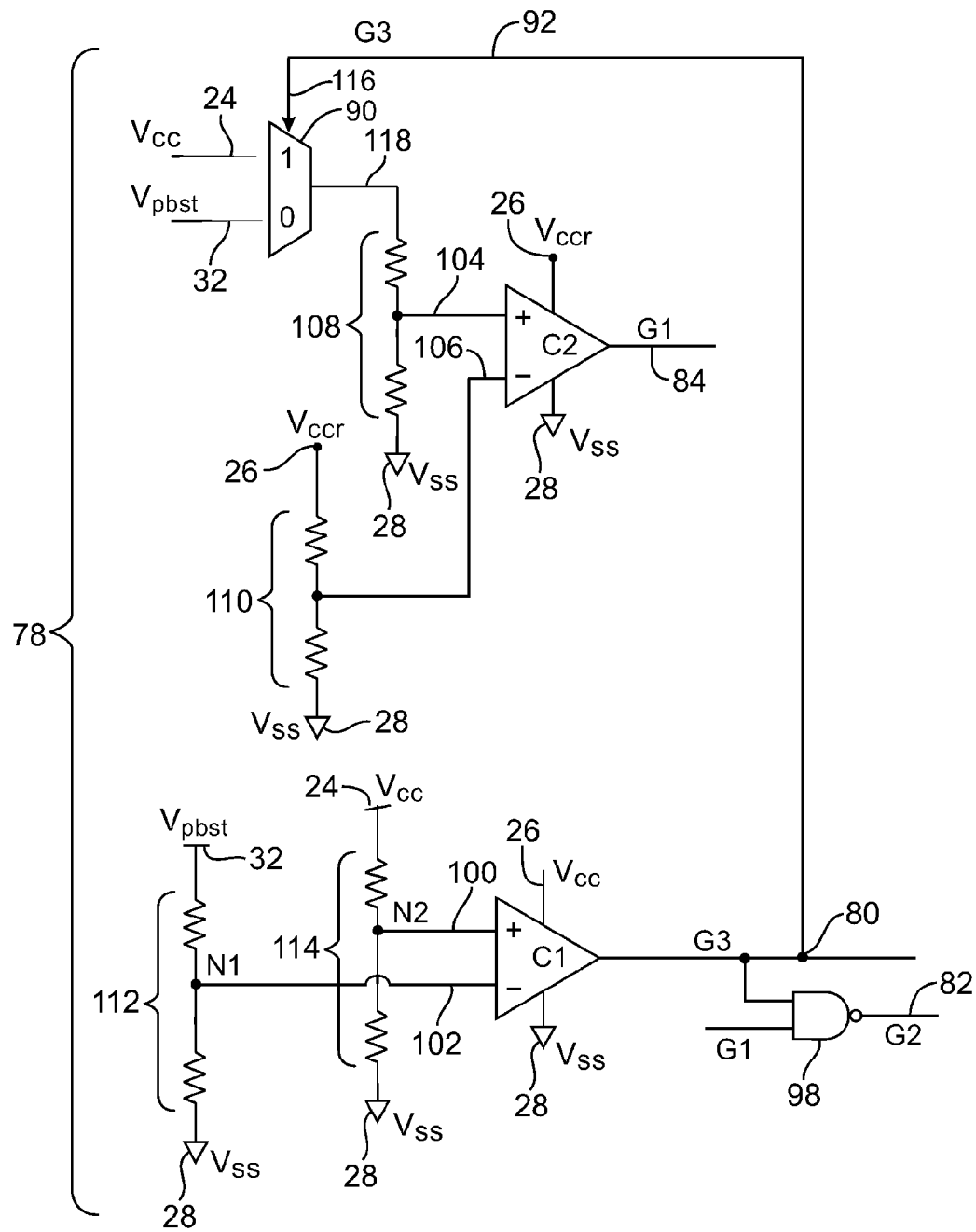
FIG. 5 is a diagram of illustrative control circuitry for generating control signals for use with body bias circuitry of the type shown in FIG. 4 in accordance with an embodiment of the present invention.

Illustrative circuitry that may be used to implement control logic 78 of FIG. 4 is shown in FIG. 5. As shown in FIG. 5, control logic 78 may have comparators C1 and C2. Comparator C2 may produce control signal G1 on output path 84. Comparator C1 may produce control signal G3 on output path 80. Logic gate 98 (e.g., a NAND gate) may be used to produce signal G2 on path 82. The output G2 will be low to turn on transistor T2 whenever G1 and G3 are both high.

Path 92 may be used to route signal G3 to control input 116 of multiplexer circuitry 90. When signal G3 on input 116 is high (i.e., at a logic one value), signal Vcc on the first multiplexer input 24 is routed to multiplexer output 118. When signal G3 on input 116 is low (i.e., at a logic zero value), signal Vpbst on second multiplexer input 32 is routed to output 118. The signal on path 118 represents the greater of Vcc and Vpbst.

Voltage dividers 108 and 110 provide scaling so that the signal on output 118 may be compared to elevated external power supply signal Vccr by comparator C2. A scaled version of the signal on line 118 is provided to the positive input 1004 of comparator C2 by voltage divider 108. A scaled version of the Vccr signal on input 26 is provided to negative input 106 of comparator C2 by voltage divider 110. The resistors in voltage dividers 108 and 110 are configured so that output G1 of comparator C2 goes low (e.g., to 0 volts) whenever Vccr is greater than both Vcc and Vpbst. When G1 goes low in this way, transistor T1 of FIG. 4 is turned on.

Voltage divider 112 is used to scale boosted voltage Vpbst on path 32. The scaled version of Vpbst on node N1 is routed to negative input 102 of comparator C1. Positive input 100 of comparator C1 receives a scaled version of voltage Vcc from node N2 of voltage divider 114. The resistors of voltage dividers 112 and 114 are configured to allow comparison of Vpbst and Vcc. In particular, voltage dividers 112 and 114 may be configured so that the voltage at node N1 of voltage divider 112 will be 0.5 volts if Vpbst is equal to its nominal full value of 0.9 volts and so that the voltage at node N2 of voltage divider 114 will be 0.5 volts if Vcc is at its nominal full value of 0.9 volts. When configured in this way, control signal G3 at the output of comparator C1 will be low whenever Vpbst is greater than Vcc. The low value of G3 turns on transistor T3 so that boosted voltage Vpbst can serve as body bias voltage Vnwbias.

Figure 6:
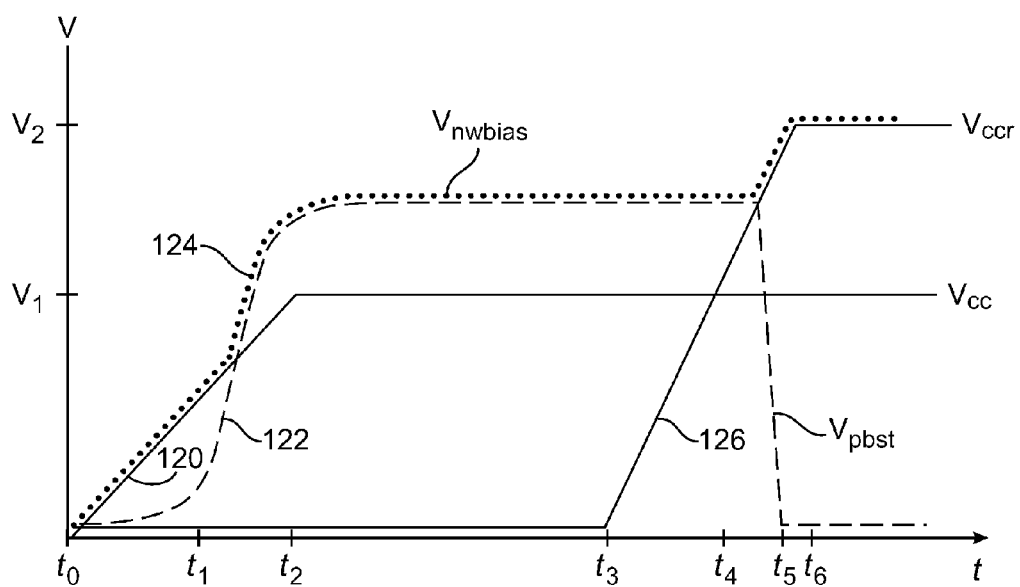
FIG. 6 is a diagram showing how body bias circuitry in accordance with an embodiment of the present invention may avoid the production of undesirable current surges when hotsocket conditions arise during power up operations.

A graph illustrating the behavior of body bias circuitry 22 during a power-up event in which power supply voltage Vccr becomes valid after power supply voltage Vcc becomes valid is shown in FIG. 6. As shown by solid line 120 in the graph of FIG. 6, power supply voltage Vcc begins to rise to its nominal value (V1) at time t0. At time t1, Vcc has risen sufficiently (e.g., to about 300 mV) to turn on the control circuitry within device 10. As a result, boost circuit 30 begins to produce a non-zero boosted voltage Vpbst, as indicated by dashed line 122. The greater of Vpbst and Vcc may be passed to path 18 (FIG. 1) by body bias circuitry 22 to serve as body bias voltage Vnwbias, as indicated by dotted line 124. At time t2, Vcc has risen to V1 (e.g., 0.9 volts) and is valid.

In the scenario of FIG. 6, elevated power supply Vccr, which is intended for use in producing body bias Vnwbias during normal operation, is not valid at time t2, as indicated by solid line 126. Nevertheless, internally generated voltage Vpbst may be used as the body bias voltage Vnwbias, thereby ensuring a low current Ioff for transistors 14 and minimizing power consumption. Boosted voltage Vpbst serves as a temporary substitute for elevated voltage Vccr because Vccr is not available (e.g., due to the way in which device 10 was inserted into a port and the resulting order in which its power pins became valid).

At time t3, power supply Vccr begins to rise. At time t4, the magnitude of Vccr exceeds that of Vcc. Because of the protection circuit behavior of circuitry 78 (FIG. 5), the control signals that are provided to transistors T1, T2, and T3 ensure that the greater of Vcc and Vpbst is used in producing Vnwbias until Vccr exceeds both of these signals. As a result, the states of transistors T1, T2, and T3 do not switch at time T4, even though Vccr has become greater than Vcc. This avoids an undesirable situation in which there is a sudden surge in power supply current (Icc) at time t4, as would occur if transistor T1 were to be turned on at time t4.

At time t5, Vccr has exceeded both Vcc and Vpbst, so it is no longer necessary to rely on the temporary boosting provided by Vpbst. As shown in FIG. 6, Vpbst is therefore taken low by taking control signal G1 at the input 54 of gate 52 low in FIG. 2 to disable boost circuit 30.

The low G1 signal also turns on transistor T1, so that voltage Vccr is switched onto output 18 of the multiplexer formed by transistors T1, T2, and T3 in FIG. 4. Transistors T2 and T3 are turned off. At time t6, voltage Vccr has risen to its nominal value V2 (e.g., 1.5 volts) and circuit 10 is operating normally. The body bias voltage in this situation will be 1.5 volts (i.e., Vccr) as desired.

As this example demonstrates, a temporary internally generated boosted voltage may be used in place of an external elevated voltage to bias body terminals B of PMOS transistors 14 during power-up operations. This ensures that the threshold voltage of transistors 14 is elevated during power-up operations, thereby reducing Ioff during power-up operations and minimizing power consumption. The body bias circuitry may include a protection circuit feature that prevents the source-to-body junctions in PMOS transistors 14 from becoming forward biased during power-up, thereby avoiding latch-up.

The foregoing is merely illustrative of the principles of this invention and various modifications can be made by those skilled in the art without departing from the scope and spirit of the invention.

What is claimed is:
1. An integrated circuit that receives first and second voltages, comprising:
    a transistor having a body terminal; and
    circuitry that receives the first voltage, that produces a third voltage that is greater than the first voltage, and that applies the greater of the second voltage and the third voltage to the body terminal as the integrated circuit powers up.

2. The integrated circuit defined in claim 1 wherein the transistor comprises a p-channel metal-oxide-semiconductor transistor having a source that receives the first voltage.

3. The integrated circuit defined in claim 1 wherein the circuitry comprises a boost circuit that receives the first voltage and that generates the third voltage.

4. The integrated circuit defined in claim 3 wherein the boost circuit comprises a plurality of charge pumps.

5. The integrated circuit defined in claim 3 wherein the boost circuit comprises:
   an output that supplies the third voltage;
   a comparator having inputs and an output;
   a feedback path from the output to one of the comparator inputs; and
   charge pump circuitry coupled to the output.

6. The integrated circuit defined in claim 5 further comprising oscillator circuitry that receives a control signal from the output of the comparator and that produces corresponding clock signals that are applied to the charge pump circuitry.

7. The integrated circuit defined in claim 6 further comprising a logic gate interposed between the comparator output and the oscillator that disables the boost circuit when the second voltage exceeds both the first voltage and the third voltage.

8. The integrated circuit defined in claim 7 wherein the first and second voltages are supplied from external sources, the integrated circuit further comprising core logic that is powered by the first voltage, wherein the transistor is included in the core logic, and wherein the second voltage is elevated with respect to the first voltage when the first and second voltages are both valid.

9. The integrated circuit defined in claim 8 wherein the circuitry comprises a multiplexer having a first input that receives the first voltage, a second input that receives the second voltage, and a third input that receives the third voltage.

10. The integrated circuit defined in claim 9 wherein the circuitry comprises control logic that supplies control signals to the multiplexer and wherein the multiplexer has an output at which a selected one of the first, second, and third voltages is supplied in response to the control signals from the control logic.

11. The integrated circuit defined in claim 10 wherein the control logic comprises multiplexer circuitry and comparator circuitry and wherein the multiplexer circuitry and comparator circuitry compares the first, second, and third voltages.

12. The integrated circuit defined in claim 10 wherein the control logic comprises a first comparator and a second comparator and wherein at least some of the control signals are supplied at outputs of the first and second comparators.

13. The integrated circuit defined in claim 10 wherein the control logic comprises:
   two-input multiplexer circuitry having an output;
   a first voltage divider having a first node to which the output of the two-input multiplexer circuitry is connected;
   a second voltage divider having a second node;
   a first comparator having two inputs respectively connected to the first and second nodes;
   a third voltage divider having a third node;
   a fourth voltage divider having a fourth node;
   a second comparator having two inputs respectively connected to the third and fourth nodes, wherein the first and second comparators have outputs, and
   a logic gate having at least one input connected to the output of the second comparator and having an output, wherein the control signals for controlling the multiplexer are supplied at the outputs of the first and second comparators and the output of the logic gate.

14. The integrated circuit defined in claim 13 wherein the multiplexer comprises three parallel p-channel metal-oxide-semiconductor transistors, wherein a first of the three parallel p-channel metal-oxide-semiconductor transistors has a first gate that is connected to the output of the first comparator, wherein a second of the three parallel p-channel metal-oxide-semiconductor transistors has a second gate that is connected to the output of the second comparator, and wherein a third of the three parallel p-channel metal-oxide-semiconductor transistors has a third gate that is connected to the output of the logic gate.

15. Circuitry on an integrated circuit, comprising:
   control logic that monitors first and second external power supply signals and an internal power supply signal and that produces corresponding control signals; and
   a multiplexer that receives the first and second external power supply signals and the internal power supply signal as inputs and that routes a selected one of these power supply signals to an output based on the control signals.

16. The circuitry defined in claim 15 further comprising a plurality of p-channel metal-oxide-semiconductor transistors having body terminals connected to the multiplexer output.

17. The circuitry defined in claim 16 further comprising a boost circuit that receives the first external power supply signal and that produces the internal power supply signal by boosting the first external power supply signal.

18. The circuitry defined in claim 17 wherein the control logic comprises at least one comparator that compares the first external power supply signal to the internal power supply signal when powering up the integrated circuit.

19. A hotsocket compatible integrated circuit, comprising:
   circuitry containing a plurality of p-channel metal-oxide-semiconductor transistors each of which has a source terminal that receives a first external power supply signal and each of which has a body terminal; and
   a multiplexer having a first input, a second input, a third input, and an output, wherein the first input receives the first external power supply signal, wherein the second input receives a second external power supply signal, wherein the third input receives an internally generated power supply signal, and wherein the output is connected to the body terminals.

20. The hotsocket compatible integrated circuit defined in claim 19 further comprising control logic that monitors the first and second external power supply signals and the internally generated power supply signal and that produces corresponding control signals for the multiplexer.

21. The hotsocket compatible integrated circuit defined in claim 19 further comprising a boost circuit that produces the internally generated power supply signal by boosting the first external power supply signal.

22. The hotsocket compatible integrated circuit defined in claim 21 further comprising control logic that monitors the first and second external power supply signals and the internally generated power supply signal and that produces corresponding control signals for the multiplexer that direct the multiplexer to route the internally generated power supply signal to the output of the multiplexer when the first external power supply signal is valid, the second external power supply signal is not valid, and the internally generated power supply signal is greater than the first external power supply signal.

23. The hotsocket compatible integrated circuit defined in claim 21 further comprising control logic that monitors the first and second external power supply signals and the internally generated power supply signal and that produces corresponding control signals for the multiplexer that direct the multiplexer to route the internally generated power supply signal to the output of the multiplexer when the first external power supply signal is valid, the second external power supply signal is not valid, and the internally generated power supply signal is greater than the first external power supply signal, and that direct the multiplexer to route the second external power supply signal to the multiplexer output when the first and second external power supply signals are both valid and the second external power supply signal is greater than both the first external power supply signal and the internally generated power supply signal.

* * * * *